United States Patent
Jeong et al.

(10) Patent No.: US 9,293,178 B1
(45) Date of Patent: Mar. 22, 2016

(54) DATA OUTPUT CIRCUIT, SEMICONDUCTOR MEMORY APPARATUS INCLUDING THE SAME, AND OPERATING METHOD THEREOF

(71) Applicant: SK hynix Inc., Icheon-si, Gyeonggi-do (KR)

(72) Inventors: Ha Jun Jeong, Icheon-si (KR); Ki Chon Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/635,052

(22) Filed: Mar. 2, 2015

(30) Foreign Application Priority Data

Dec. 5, 2014 (KR) .................. 10-2014-0174446

(51) Int. Cl.
- G11C 7/00 (2006.01)
- G11C 7/10 (2006.01)
- G11C 8/18 (2006.01)
- G11C 5/02 (2006.01)

(52) U.S. Cl.
CPC ............. *G11C 7/109* (2013.01); *G11C 5/025* (2013.01); *G11C 7/1012* (2013.01); *G11C 7/1039* (2013.01); *G11C 7/1051* (2013.01); *G11C 8/18* (2013.01)

(58) Field of Classification Search
CPC .... G11C 5/025; G11C 7/1012; G11C 7/1039; G11C 7/1051; G11C 8/18; G11C 7/109

USPC .............. 365/193, 51, 129, 189.011, 189.14, 365/189.15, 189.16, 189.05, 191
See application file for complete search history.

(56) References Cited

U.S. PATENT DOCUMENTS 9,001,595 B1 * 4/2015 Shiao ................ G11C 5/04 326/21

FOREIGN PATENT DOCUMENTS

| KR | 100915832 B1 | 8/2009 |
| KR | 1020110088931 A | 8/2011 |

* cited by examiner

*Primary Examiner* — Fernando Hidalgo
(74) *Attorney, Agent, or Firm* — William Park & Associates Ltd.

(57) ABSTRACT

A data output circuit may include a first node, which receives a first strobe signal, a second node, which receives a second strobe signal, an input control unit that is coupled to the first and second nodes, and receives the first strobe signal generated from a single strobe signal transmitted through a first path of a semiconductor memory apparatus and the second strobe signal generated from the single strobe signal transmitted from a second path of the semiconductor memory apparatus in response to a read command, generates a first input control signal based on the first strobe signal and the second strobe signal, and generates a second input control signal based on the second strobe signal.

15 Claims, 4 Drawing Sheets

DATA OUTPUT CIRCUIT, SEMICONDUCTOR MEMORY APPARATUS INCLUDING THE SAME, AND OPERATING METHOD THEREOF

This application claims priority under 35 U.S.C. §119(a) to Korean application No. 10-2014-0174446 filed on Dec. 5, 2014, in the Korean Intellectual Property Office, which is incorporated by reference in its entirety.

BACKGROUND

1. Technical Field

Embodiments of the present invention generally relate to an integrated circuit, and more particularly, in one or more embodiments, to a data output circuit, a semiconductor memory apparatus including the same, and an operating method thereof.

2. Related Art

When a semiconductor memory apparatus responds to a read command from the corresponding memory controller, data bits may be read out not only from a single cell block but also from multiple cell blocks in response to address signals.

Multiple cell blocks (e.g., bank) are provided to be simultaneously working on different request. When data bits are read out from multiple cell blocks, the data bits may be transferred to a pipe latch unit through a global input/output line, which is shared by multiple cell blocks. In a semiconductor memory apparatus, an address strobe signal may be used to activate a particular address, and a data strobe signal may be used to capture data signals. A strobe signal may be generated by column signal for each cell block in response to a read command. A data strobe signal corresponding to a bust length may be generated in response to the strobe signal, and data transmitted through the global input/output line may be temporarily stored in the pipe latch unit in synchronization with the data strobe signal. The data stored in the pipe latch unit may be outputted in response to an output strobe signal.

To read out data without error, a margin between the timing of data transmission through the global input/output line and the timing of data strobe signal generation may be considered as an important factor.

SUMMARY

In an embodiment, a data output circuit may include: a first node configured to receive a first strobe signal; a second node configured to receive a second strobe signal; and an input control unit coupled to the first and second nodes, wherein the input control unit receives the first strobe signal generated from a single strobe signal transmitted through a first path of a semiconductor memory apparatus and the second strobe signal generated from the single strobe signal transmitted from a second path of the semiconductor memory apparatus in response to a read command, generates a first input control signal based on the first strobe signal and the second strobe signal, and generates a second input control signal based on the second strobe signal.

In an embodiment, a semiconductor memory apparatus may include: a core area including a plurality of cell blocks; and a peripheral area including a data output circuit, wherein the data output circuit may receive a first strobe signal generated from a single strobe signal transmitted through a first path and a second strobe signal generated from the single strobe signal transmitted from a second path of the semiconductor memory apparatus in response to a read command, generate a first input control signal based on the first strobe signal and the second strobe signal, and generate a second input control signal based on the second strobe signal.

In an embodiment, an operating method of a semiconductor memory apparatus including a core area with a plurality of cell blocks and a peripheral area with a data output circuit may include the steps of: receiving a first strobe signal generated from a single strobe signal transmitted through a first path and a second strobe signal generated from the single strobe signal transmitted from a second path in response to a read command; and generating a first input control signal based on the first strobe signal and the second strobe signal, and generating a second input control signal based on the second strobe signal.

These and other features, aspects, and embodiments are described below in the section entitled "DETAILED DESCRIPTION".

BRIEF DESCRIPTION OF THE DRAWINGS

The above and other aspects, features and advantages of embodiments will be more clearly understood from the following detailed description taken in conjunction with the accompanying drawings, in which.

DETAILED DESCRIPTION

Figure 1:
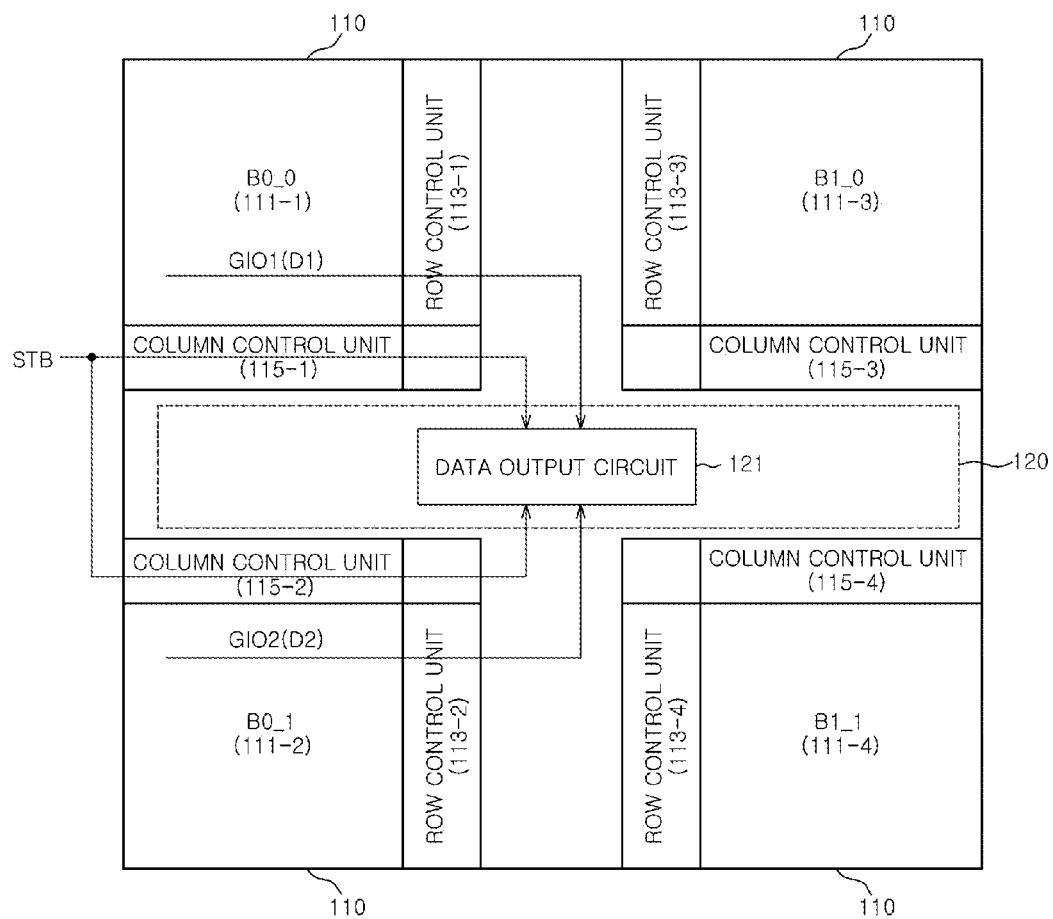
FIG. 1 is a configuration diagram of a semiconductor memory apparatus according to an embodiment.

Exemplary embodiments will be described in greater detail with reference to the accompanying drawings. Exemplary embodiments are described herein with reference to cross-sectional illustrations that are schematic illustrations of exemplary embodiments (including intermediate structures). As such, variations from the illustrations in shape due to differences in, for example, manufacturing techniques and/or tolerances, are to be expected. Thus, embodiments should not be construed as limited to the particular shapes illustrated herein but may include modifications. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present. It is also noted that in this specification, "connected/coupled" refers to where one component is connected/coupled to another component either directly or indirectly, through an intermediate component. In addition, a singular form may include a plural form, and vice versa, as long as it is not specifically mentioned otherwise.

Embodiments are described herein with reference to cross-section and/or plan illustrations that are schematic illustrations. However, embodiments should not be construed as limited thereto. Although a few embodiments will be shown and described, it will be appreciated that changes may be made in these exemplary embodiments.

FIG. 1 is a configuration diagram of a semiconductor memory apparatus according to an embodiment.

A semiconductor memory apparatus 10 may include a core area 110 and a peripheral area 120.

The core area 110 may include a plurality of cell blocks 111-1, 111-2, 111-3, 111-4. Each cell block 111-1, 111-2, 111-3, 111-4 may include one of row control units 113-1, 113-2, 113-3, 113-4 and one of column control units 115-1, 115-2, 115-3, 115-4.

The cell block 111 may include a plurality of unit memory cells coupled to word lines (not illustrated) and bit lines (not illustrated).

The row control units 113 may receive a row address and decode it. The row control units 113 may select one of a plurality of word lines according to the row address. The column control units 115 may receive a column address and decode it. The column control units 115 may select one of a plurality of bit lines according to the column address.

The peripheral area 120 may include a data output circuit 121, and control circuits for controlling the operation of the core area 110, a command word decoder (not shown), a power supply circuit (not shown), and an input/output pad (not shown).

In an embodiment, the cell blocks 111-1, 111-2, 111-3, 111-4 may constitute the core area 110. The core area 110 may have a half-cell block structure. For example, the core area 110 may have left cell blocks 111-1 and 111-2 and right cell blocks 111-3 and 111-4. The left cell blocks 111-1 and 111-2 may include an upper block 111-1 and a lower block 111-2, and the right cell blocks 111-3 and 111-4 may include an upper block 111-3 and a lower block 111-4.

In an embodiment, when reading out data from the left cell blocks 111-1 and 111-2, data stored in the upper block 111-1 and data stored in the lower block 111-2 may be read at the same time to speed up read operations.

When reading out data from the left cell blocks 111-1 and 111-2, first data D1 read from the upper block 111-1 may be transferred to the data output circuit 121 through a first global input/output line GIO1, and second data D2 read from the lower block 111-2 may be transferred to the data output circuit 121 through a second global input/output line GIO2.

A strobe signal generated in a strobe signal generation unit (not illustrated) may be delayed while being transmitted via the column control unit 115-1 of the upper block 111-1. The delayed strobe signal, which is delayed while being transmitted via the column control unit 115-1 of the upper block 111-1, may be referred to as a first strobe signal STB1, and may be transferred to the data output circuit 121. The strobe signal may also be transmitted via the column control unit 115-2 of the lower block 111-2. The strobe signal may be delayed while being transmitted via the column control unit 115-2 of the lower block 111-2, and this delayed strobe signal may be referred to as a second strobe signal STB2. The second strobe signal STB2 may also be transferred to the data output circuit 121.

The data output circuit 121 may generate a first input control signal PIN1 (not shown) and a second input control signal PIN2 (not shown) based on the first and second strobe signals STB1 and STB2 transferred via the column control units 115-1 and 115-2.

In an embodiment, the data output circuit 121 may generate the first input control signal PIN1 based on the first strobe signal STB1 and the second strobe signal STB2, and generate the second input control signal PIN2 based on the second strobe signal STB2.

Accordingly, the first data D1 may be provided to a first pipe latch circuit (not shown) in synchronization with the first input control signal PIN1, and the second data D2 may be provided to a second pipe latch circuit (not shown) in synchronization with the second input control signal PIN2.

The data D1 and D2 stored in the first and second pipe latch circuits may be outputted in synchronization with first and second output control signals, and then may be outputted through an input/output pad.

In an embodiment, the data output circuit 121 may receive the first and second strobe signals STB1 and STB2 transferred through the column control units 115-1 and 115-2 provided in the upper and lower blocks 111-1 and 111-2, generate the first input control signal PIN1 based on the first and second strobe signals STB1 and STB2, and generate the second input control signal PIN2 based on the second strobe signal STB2. When the data D1 and D2 read from the upper and lower blocks 111-1 and 111-2 are transferred to the data output circuit 121 through the global input/output lines GIO1 and GIO2, the first data D1 may be stored in the first pipe latch circuit in synchronization with the first input control signal PIN1 and the second data D2 may be stored in the second pipe latch circuit in synchronization with the second input control signal PIN2.

Figure 2:
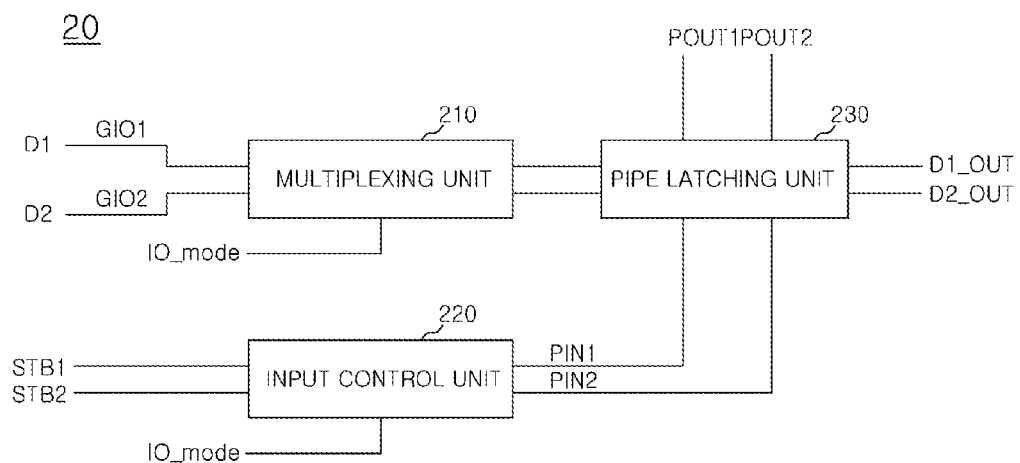
FIG. 2 is a configuration diagram of a data output circuit according to an embodiment.

FIG. 2 is a configuration diagram of a data output circuit according to an embodiment.

A data output circuit 20 may include a multiplexing unit 210, an input control unit 220, and a pipe latching unit 230.

The multiplexing unit 210 may receive the first data D1 transferred from a first cell block through the first global input/output line GIO1 and the second data D2 transferred from a second cell block through the second global input/output line GIO2, and output the first data D1 and the second data D2.

In an embodiment, the first cell block and the second cell block may indicate an upper block and a lower block included in any one cell block having a half-cell block structure.

The input control unit 220 may receive the first strobe signal STB1 transferred through a first path, and the second strobe signal STB2 transferred through a second path, and generate the first input control signal PIN1 and the second input control signal PIN2. For example, the first path may be a column control unit of the first cell block, and the second path may be a column control unit of the second cell block. The input control unit 220 may include a first node (not shown) coupled to the first path and a second node (not shown) coupled to the second path. The input control unit 220 may receive the first strobe signal STB1, which is transferred through the first path, to the first node, and may receive the second strobe signal STB2, which is transferred through the second path, to the second node.

Each of the first strobe signal STB1 and the second strobe signal STB2 may be a signal which is formed by delaying a single strobe signal through respective transmission paths. In an embodiment, the input control unit 220 may generate the first input control signal PIN1 in response to the first strobe signal STB1 and the second strobe signal STB2, and generate the second input control signal PIN2 in response to the second strobe signal STB2.

In an embodiment, the multiplexing unit 210 may receive an input/output mode signal IO_mode, and output the first data D1 and the second data D2 according to a burst length corresponding to the input/output mode signal IO_mode.

The input control unit 220 may also receive the input/output mode signal IO_mode. The input control unit 220 may generate the first input control signal PIN1 based on the input/output mode signal IO_mode in addition to the first and second strobe signals STB1 and STB2, and may generate the second input control signal PIN2 based on the input/output mode signal IO_mode in addition to the second strobe signal STB2.

In an embodiment, when the burst length corresponding to the input/output mode signal IO_mode has a first value, the input control unit 220 may enable all the first input control signal PIN1 and the second input control signal PIN2. When the burst length has a second value, the input control unit 220 may enable only the first input control signal PIN1.

The pipe latching unit 230 may store the first data D1 in response to the first input control signal PIN1, and store the second data D2 in response to the second input control signal PIN2.

Furthermore, the pipe latching unit 230 may output the latched first data D1 in response to a first output control signal POUT1 and output the latched second data D2 in response to a second output control signal POUT2.

Figure 3:
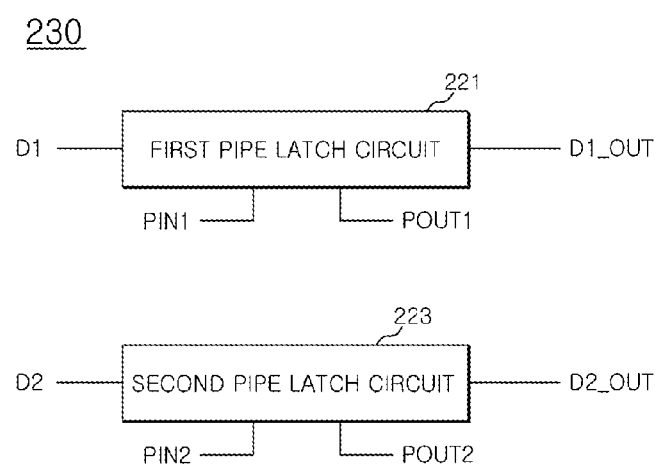
FIG. 3 is an exemplary diagram of a pipe latch unit according to an embodiment.

As illustrated in FIG. 3, the pipe latching unit 230 may include a first pipe latch circuit 221 and a second pipe latch circuit 223. The first pipe latch circuit 221 may store the first data D1 in response to the first input control signal PIN1, and generate output data D1_OUT from the first data D1 in response to the first output control signal POUT1. The second pipe latch circuit 223 may store the second data D2 in response to the second input control signal PIN2, and generate output data D2_OUT from the second data D2 in response to the second output control signal POUT2.

Since the first data D1 and the second data D2 from cell blocks different from each other are transferred through different global input/output lines (e.g., the first data D1 may be transmitted through the first global input/output line GIO1 and the second data D1 may be transmitted through the second global input/output lines GIO2), a delay time of the first data D1 may be different from that of the second data D2. Since the first strobe signal STB1 and the second strobe signal STB2 are also transferred through transmission paths different from each other, a delay time of the first strobe signal STB1 may be different from that of the second strobe signal STB2.

In an embodiment, the first data D1 may be stored by the first input control signal PIN1 generated based on the first and second strobe signals STB1 and STB2, and the second data D2 may be stored by the second input control signal PIN2 generated based on the second strobe signal STB2, thereby ensuring a timing margin between the first data D1 and the first input control signal PIN1, and between the second data D2 and the second input control signal PIN2.

Figure 4:
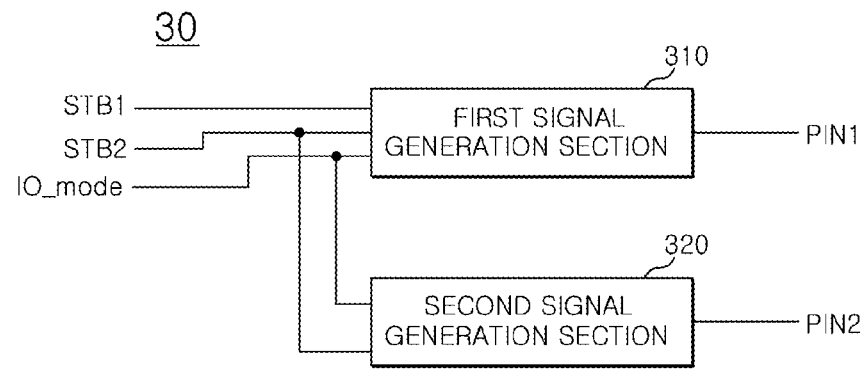
FIG. 4 is a configuration diagram of an input control unit according to an embodiment.

FIG. 4 is a configuration diagram of an input control unit according to an embodiment.

An input control unit 30 according to an embodiment may include a first signal generation section 310 and a second signal generation section 320.

The first signal generation section 310 may generate the first input control signal PIN1 in response to the first and second strobe signals STB1 and STB2. The second signal generation section 320 may generate the second input control signal PIN2 in response to the second strobe signal STB2.

In an embodiment, the first signal generation section 310 and the second signal generation section 320 may further receive the input/output mode signal IO_mode.

When the burst length corresponding to the input/output mode signal IO_mode has a first value, all the first input control signal PIN1 and the second input control signal PIN2 outputted from the first and second signal generation sections 310 and 320 may be enabled. When the burst length has a second value, only the first input control signal PIN1 outputted from the first signal generation section 310 may be enabled.

Figure 5:
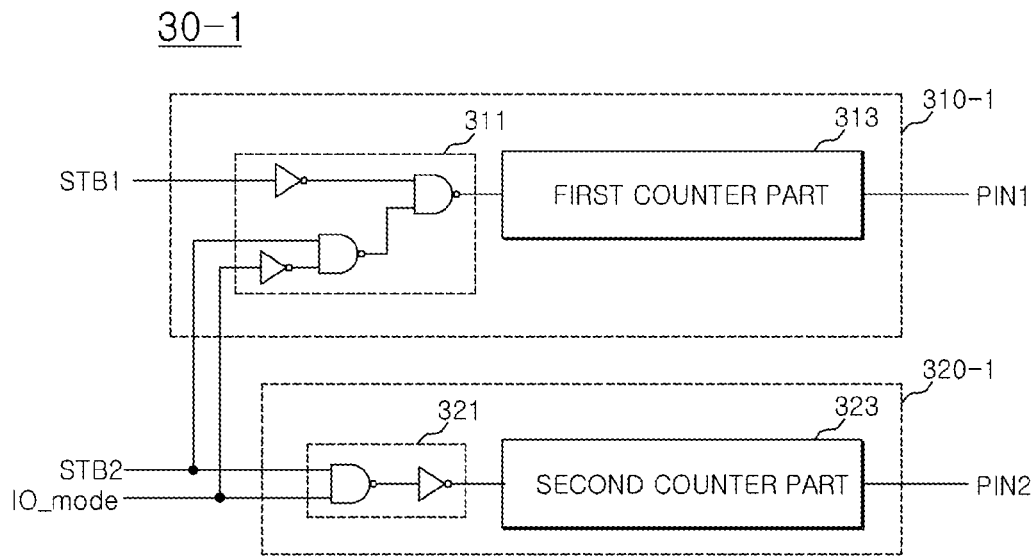
FIG. 5 is a circuit diagram of an input control unit according to an embodiment.

FIG. 5 is a circuit diagram of an input control unit according to an embodiment.

A first signal generation section 310-1 of an input control unit 30-1 may include a first pulse generation part 311 that receives the first and second strobe signals STB1 and STB2 and generates a first pulse, and a first counter part 313 that counts a number of pulse of an output signal of the first pulse generation part 311 and outputs the first input control signal PIN1.

A second signal generation section 320-1 may include a second pulse generation part 321 that receives the second strobe signal STB2 and generates a second pulse, and a second counter part 323 that counts a number of pulse of an output signal of the second pulse generation part 321 and outputs the second input control signal PIN2.

When the input control unit 30-1 further receives the input/output mode signal IO_mode, all the first and second input control signals PIN1 and PIN2, or only the first input control signal PIN1 may be enabled according to the logic level of the input/output mode signal IO_mode (e.g., the value of the burst length).

Figure 6:
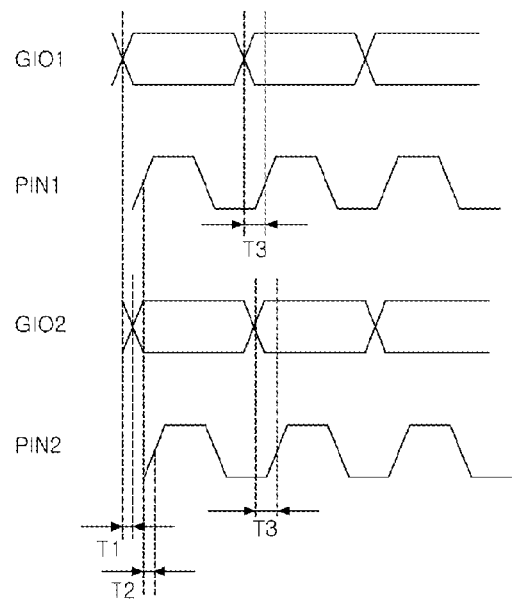
FIG. 6 is a data output timing diagram according to an embodiment.

FIG. 6 is a data output timing diagram according to an embodiment.

As illustrated in FIG. 6, a delay time difference T1 exists between the first data D1 transmitted through the first global input/output line GIO1 and the second data D2 transmitted through the second global input/output lines GIO2.

In an embodiment, the first input control signal PIN1 may be generated based on the first and second strobe signals STB1 and STB2, and the second input control signal PIN2 may be generated based on the second strobe signal STB2. Thus, a timing difference T2 also exists between the first input control signal PIN1 and the second input control signal PIN2.

Based on the first and second input control signals PIN1 and PIN2 generated as above, the first data D1 may be stored in the pipe latch circuit in synchronization with the first input control signal PIN1 within a predetermined timing margin T3. In addition, the second data D2 may be stored in the pipe latch circuit in synchronization with the second input control signal PIN2 within the predetermined timing margin T3.

In the an embodiment, the pipe latch circuit may have a constant timing margin between data and an input control signal by controlling with an independent input control signal.

Figure 7:
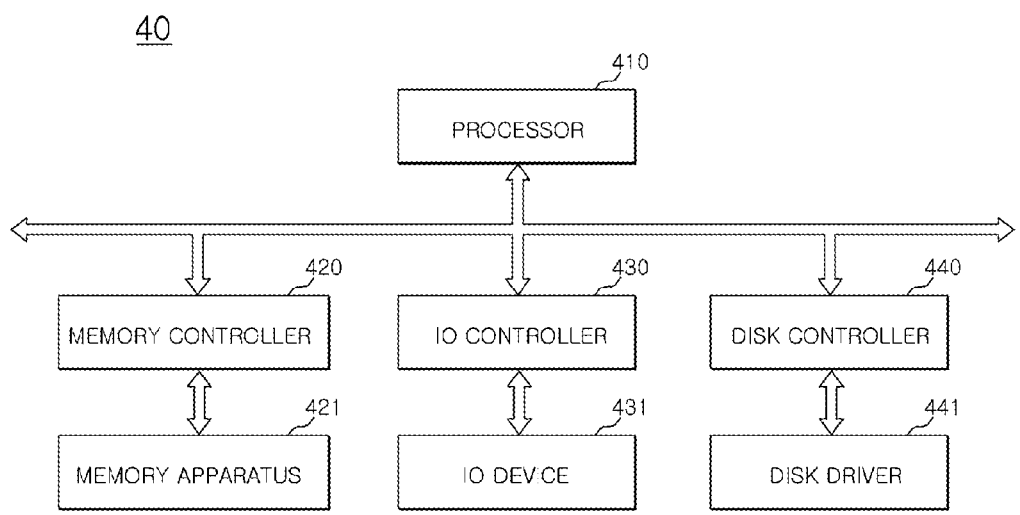
FIG. 7 is a configuration diagram of an electronic system according to an embodiment.

FIG. 7 is a configuration diagram of an electronic system according to an embodiment.

An electronic system 40 according to an embodiment may include a processor 410, a memory controller 420, a memory apparatus 421, an IO controller 430, an IO device 431, a disk controller 440, and a disk driver 441.

One or more processors 410 may be provided, and may operate independently or in cooperation with another processor. The processor 410 may have an environment capable of communicating with other elements, for example, the memory controller 420, the IO controller 430, and the disk controller 440, through a bus (e.g., a control bus, an address bus, or a data bus).

The memory controller 420 may be coupled to one or more memory apparatuses 421. The memory controller 420 may receive a request from the processor 410, and control one or more memory apparatuses 421 based on the request.

The memory apparatus 421, for example, may include the aforementioned semiconductor memory apparatus.

The IO controller 430 may couple the processor 410 to the IO device 431, and transfer signals from the IO device 431 to the processor 410 or from the processor 410 to the IO device 431. The IO device 431 may include an input device such as a keyboard, a mouse, a touchscreen, or a microphone, and an output device such as a display or a speaker.

The disk controller 440 may control one or more disk drivers 441 under the control of the processor 410.

In such an electronic system 40, when a read command of data stored in the memory apparatus 421 is inputted by the processor 410, data outputted from the memory apparatus 421 may be stored in the pipe latch unit in synchronization with the first and second input control signals PIN1 and PIN2, and then is outputted in synchronization with the first and second output control signals POUT1 and POUT2.

The above embodiments are illustrative and not limitative. Various alternatives and modifications are possible.

What is claimed is:

1. A data output circuit comprising:
   a first node configured to receive a first strobe signal;
   a second node configured to receive a second strobe signal; and
   an input control unit coupled to the first and second nodes, wherein the input control unit receives the first strobe signal generated from a single strobe signal transmitted through a first path of a semiconductor memory apparatus and the second strobe signal generated from the single strobe signal transmitted from a second path of the semiconductor memory apparatus in response to a read command, generates a first input control signal based on the first strobe signal and the second strobe signal, and generates a second input control signal based on the second strobe signal.

2. The data output circuit according to claim 1, wherein the semiconductor memory apparatus includes a plurality of cell blocks, and the data output circuit further comprises:
   a multiplexing unit configured to receive first data transmitted through a first global input/output line of a first cell block and second data transmitted through a second global input/output line of a second cell block; and
   a pipe latching unit configured to store the first data in response to the first input control signal and store the second data in response to the second input control signal.

3. The data output circuit according to claim 2, wherein the cell block is divided into an upper block and a lower block, and the first cell block is the upper block and the second cell block is the lower block.

4. The data output circuit according to claim 1, wherein the semiconductor memory apparatus includes a cell block divided into an upper block and a lower block, the first strobe signal is transmitted through the first path associated with the upper block, and the second strobe signal is transmitted through the second path associated with the lower block.

5. The data output circuit according to claim 1, wherein the input control unit generates the first input control and the second input control signal in response to an input/output mode signal.

6. A semiconductor memory apparatus comprising:
   a core area including a plurality of cell blocks; and
   a peripheral area including a data output circuit,
   wherein the data output circuit receives a first strobe signal generated from a single strobe signal transmitted through a first path and a second strobe signal generated from the single strobe signal transmitted from a second path of the semiconductor memory apparatus in response to a read command, generates a first input control signal based on the first strobe signal and the second strobe signal, and generates a second input control signal based on the second strobe signal.

7. The semiconductor memory apparatus according to claim 6, wherein the data output circuit further comprises:
   a multiplexing unit configured to receive first data transmitted through a first global input/output line of a first cell block and second data transmitted through a second global input/output line of a second cell block; and
   a pipe latching unit configured to store the first data in response to the first input control signal and store the second data in response to the second input control signal.

8. The semiconductor memory apparatus according to claim 7, wherein the cell block is divided into an upper block and a lower block, and the first cell block is the upper block and the second cell block is the lower block.

9. The semiconductor memory apparatus according to claim 6, wherein each of the plurality of cell blocks is divided into an upper block and a lower block, the first strobe signal is transmitted through the first path associated with the upper block, and the second strobe signal is transmitted through the second path associated with the lower block.

10. The semiconductor memory apparatus according to claim 6, wherein the data output circuit generates the first input control and the second input control signal in response to an input/output mode signal.

11. An operating method of a semiconductor memory apparatus including a core area with a plurality of cell blocks and a peripheral area with a data output circuit, comprising the steps of:
    receiving a first strobe signal generated from a single strobe signal transmitted through a first path and a second strobe signal generated from the single strobe signal transmitted from a second path in response to a read command; and
    generating a first input control signal based on the first strobe signal and the second strobe signal, and generating a second input control signal based on the second strobe signal.

12. The operating method of a semiconductor memory apparatus according to claim 11, further comprising the steps of:
    receiving first data transmitted through a first global input/output line of a first cell block and second data transmitted through a second global input/output line of a second cell block in response to the read command; and
    storing the first data in response to the first input control signal and storing the second data in response to the second input control signal.

13. The operating method of a semiconductor memory apparatus according to claim 12, wherein the cell block is divided into an upper block and a lower block, and the first cell block is the upper block and the second cell block is the lower block.

14. The operating method of a semiconductor memory apparatus according to claim 11, wherein the cell block is divided into an upper block and a lower block, the first strobe signal is transmitted through the first path associated with the upper block, and the second strobe signal is transmitted through the second path associated with the lower block.

15. The operating method of a semiconductor memory apparatus according to claim 11, wherein the first input control signal and the second input control signal are generated in response to an input/output mode signal.

* * * * *